US008773197B2

(12) United States Patent
Forman et al.

(10) Patent No.: US 8,773,197 B2
(45) Date of Patent: Jul. 8, 2014

(54) DISTORTION CORRECTION IN CLASS-D AMPLIFIERS

(71) Applicant: ESS Technology, Inc., Fremont, CA (US)

(72) Inventors: Dustin Dale Forman, Kelowna (CA); Trevor Blake Lynch-Staunton, West Kelowna (CA); Montana T. C. Reid, Penticton (CA)

(73) Assignee: ESS Technology, Inc., Fremont, CA (US)

( * ) Notice: Subject to any disclaimer, the term of this patent is extended or adjusted under 35 U.S.C. 154(b) by 72 days.

(21) Appl. No.: 13/683,637

(22) Filed: Nov. 21, 2012

(65) Prior Publication Data

US 2013/0241647 A1    Sep. 19, 2013

Related U.S. Application Data

(60) Provisional application No. 61/563,023, filed on Nov. 22, 2011.

(51) Int. Cl.
*H03F 3/38* (2006.01)

(52) U.S. Cl.
USPC ............................................ 330/10; 330/251

(58) Field of Classification Search
CPC ......... H03F 3/19; H03F 3/21; H03F 2200/78; H03F 3/193; H03F 3/217; H03F 3/2173; H03F 3/26; H03F 3/2171; H03F 2200/351; H03F 2200/331; H03F 2200/03; H03K 7/08; H03K 17/063; H03K 17/0822; H03K 5/1565
USPC .......................................... 330/10, 207 A, 251
See application file for complete search history.

(56) References Cited

U.S. PATENT DOCUMENTS

| 7,586,370 B2 * | 9/2009 | Morishima ..................... 330/10 |
| 7,692,488 B2 * | 4/2010 | Wong et al. ..................... 330/10 |
| 7,701,287 B2 * | 4/2010 | Cheng et al. .................. 330/251 |
| 7,800,437 B2 * | 9/2010 | Khoury et al. ................ 330/251 |

* cited by examiner

*Primary Examiner* — Khanh V Nguyen
(74) *Attorney, Agent, or Firm* — Gard & Kalsow LLP

(57) ABSTRACT

The present application describes an apparatus and method for reducing distortion in a class-D amplifier. The power output section of the amplifier is driven by an adjusted PWM signal, rather than by a PWM signal created directly from the input analog signal. A reference output, designed to closely track the input analog signal, is compared to the amplifier output. The resulting difference is an error signal which is inverted and summed with a second analog signal corresponding to the directly created PWM signal and changes the timing of the voltage transitions of the second analog signal. The changed voltage transitions are used to create the adjusted PWM signal. The inversion of the error signal causes negative feedback which results in the adjustment of the PWM signal being in a direction which reduces the error signal and thus the distortion of the amplifier.

19 Claims, 11 Drawing Sheets

US 8,773,197 B2

DISTORTION CORRECTION IN CLASS-D AMPLIFIERS

This application claims priority from Provisional Application 61/563,023, filed Nov. 22, 2011, which is incorporated by reference in its entirety.

FIELD OF THE INVENTION

The present invention relates generally to amplifiers, and more particularly to class-D amplifiers.

BACKGROUND OF THE INVENTION

A class-D amplifier, also sometimes called a switching amplifier, is a device for amplifying signals in which all of the power devices are operated as binary switches that are either fully on or fully off. Thus, the amplifier does not attempt to create the output directly, but rather makes a series of transitions between a defined set of discrete levels such that the time-average of the amplifier output is equal to the desired output. Most commonly, the defined set of discrete levels consists of two levels, and the binary switches are power transistors, for example MOSFETs or bipolar transistors.

The time-average output is typically determined by connecting a filter to the output of the amplifier, and desirable features may be achieved by including an inductor as part of the filter. In particular, if the output of a class-D amplifier passes through a low pass inductor-capacitor (LC) filter before reaching the intended load, the efficiency of the power delivered to the load is significantly higher than what is obtained from a conventional non-class-D amplifier configuration.

The improved efficiency is due in part to the fact that power dissipated in an amplifier itself, rather than the load, is largely the voltage drop in the output elements of the amplifier times the current delivered across that voltage drop (power equals voltage times current). However, in a class-D amplifier there is in theory no voltage difference between the currently active discrete level and the output, so that the power dissipated in the element used to connect to the currently active level is zero. Also, the elements that facilitate the output connection to any currently inactive levels conduct no current, so again the power dissipation in such elements is also zero. A class-D amplifier is thus theoretically 100% efficient.

In practice, a class-D amplifier is actually typically 90-95% efficient, clue to small but finite resistances in the switching elements, as the transistors are not perfect switches. By contrast, however, linear AB-class amplifiers always have both flowing current and voltage drops across the power devices, and thus lower efficiency.

FIG. 1 shows such a typical prior art class-D amplifier 100 having two discrete levels. Transistors M1 and M2 may form a complementary pair although this is not required; transistor M1 and its associated control input is used to connect the output to a first discrete Level One, while transistor M2 and its associated control input is used to connect the output to a second discrete Level Two. When transistor M1 is active, the amplifier output is at Level One; since there is no voltage drop across transistor M1, it dissipates no power. At this time, transistor M2 conducts no current, and thus also dissipates no power.

When the transistors M1 and M2 switch, the situation reverses. Now when transistor M2 is active, the amplifier output is at Level Two, and there is no voltage drop across transistor M2, and thus no power dissipation. Transistor M1 conducts no current now, and thus also dissipates no power. Thus, both possible output states result in no power dissipation by the amplifier elements.

Class-D amplifier 100 will execute a series of transitions between Level One and Level Two. As it does so, the average value of the amplifier output is created on the load connection by an LC filter. The average value will be a voltage in between Level One and Level Two, in proportion to the relative time spent at each level. For example, if the amplifier spends equal time at each level, the load connection will be at a voltage halfway between the Level One and Level Two voltages, while if the amplifier spends three times as much time at Level Two as at Level One, the load connection will be at a voltage that is three-quarters of the way between the levels.

The general expression of the load voltage is thus:

$$V_{load} = V_1 + (V_2 - V_1)^* \text{DutyCycle}$$

where $V_1$ and $V_2$ are the voltages of Level One and Level Two respectively and DutyCycle is the duty cycle of the amplifier, i.e., the fraction of the total time that the amplifier spends at Level Two. (One of skill in the art will appreciate that similar considerations apply where there are mere than two discrete levels, but the mathematics are more complex.)

Thus, by controlling the duty cycle of a class-D amplifier, the voltage on the load may be controlled, without dissipating any power in the elements thereof. One way to create a control signal that may be applied to the switching elements with the appropriate duty cycle is by a pulse width modulator (PWM). A PWM modifies its own output width such that a desired modulation is present in the duty cycle; when connected to a class-D amplifier, the PWM duty cycle will appear as a signal present in the voltage on the load. For example, in an audio application (a common use of class-D amplifiers) the PWM duty cycle encodes the audio signal. Which then appears on the load, for example, loud speakers.

In addition, class-D amplifiers are also compact, can switch states quickly, can be made at relatively low cost, and can deliver significant power, for example to power speakers in audio applications. These factors account for their commercial desirability.

However, the filtered output is not exactly proportional to the duty cycle of the PWM input signal. There may be different delays from the control signal to the switching elements, finite rise and fall times that are necessary to switch between the discrete output levels, and other non-idealities in the amplifier that result in an imperfect translation from the duty cycle input to the voltage on the load. This imperfect translation is distortion. Distortion can also vary depending upon the load, temperature and/or other operating parameters.

Thus, for example, a load such as a speaker may receive a signal that contains distortion in the audio output. In some cases, even, distortion of 0.1%, or one part in a thousand, may be audible to a listener.

For these reasons, a simple and inexpensive way of lessening the amount of distortion that occurs in a class-D amplifier would be useful.

SUMMARY OF THE INVENTION

The present application describes an apparatus and method for lessening the distortion in class-D amplifiers. In one embodiment, a class-D amplifier circuit is described, comprising: a first controller for generating a first PWM signal which alternates between two PWM signal values corresponding to an input signal; a DAC for creating a correction signal which is greater than a first selected value when the PWM signal is at a first one of the two values and less than the first selected value when the PWM signal is at the other of the two PWM signal values, and which crosses zero when the PWM signal transitions from one of the two PWM signal values to the other; a second controller for summing the correction signal and an error signal and generating a second PWM signal, the second PWM signal corresponding to the sum of the correction signal and the error signal and changing state when the sum crosses a second selected value; a first switching element and a second switching element connected in series between two voltages for receiving the second PWM signal and producing in response thereto a first output signal of a power sufficient for driving a desired load with a distortion of the input signal; a third switching element and a fourth switching element connected in series between two voltages for receiving the first PWM signal and producing a second output signal with a lower distortion of the input signal than the first output signal; and a third controller for generating the error signal based upon the difference between the first output signal and the second output signal.

Another embodiment describes a method of reducing distortion in a class-D amplifier circuit having a first pair of switching elements in series between two voltages and which produces an output signal of a power sufficient for driving a load in response to a PWM comprising: generating a first PWM signal corresponding to an input signal; generating a correction signal which is greater than a first selected value when the PWM signal is at a first one of two PWM signal values and less than the first selected value When the PWM signal is at the other of the two PWM signal values, and which crosses zero when the PWM signal transitions from one of the two PWM signal values to the other; summing the correction signal and an error signal and generating a second PWM the second PWM signal corresponding to the sum of the correction signal and the error signal and changing state when the sum crosses a second selected value; driving the first pair of switching elements with the second PWM signal to generate the output signal; producing a reference signal of a lower power than the output signal based upon the first PWM signal; and generating the error signal based upon the difference between the output signal and the reference signal.

DETAILED DESCRIPTION OF THE INVENTION

The present application describes an apparatus and method for improving the performance of class-D amplifiers by causing the output signal to more closely track the input signal, i.e., by lessening the amount of distortion of the input signal. One way to determine whether the power output of a class-D amplifier deviates from the input PWM signal is to create a second "output" in addition to the desired power output of the amplifier. This second output is a reference signal that does not attempt to create a high power output but rather seeks to accurately convert the PWM signal to an analog voltage. The reference signal may then be compared to the high-power output to determine whether the high-power output differs from the input signal and to generate an error signal indicating the difference.

In one embodiment, the input PWM signal is also used to create an analog signal which is summed with the error signal. From this summed signal, a second PWM signal is created which is used to drive the main portion of the amplifier and create the power output. Due to negative feedback, this second PWM signal is constantly adjusted to minimize the difference between the power output and the reference signal.

Figure 1:
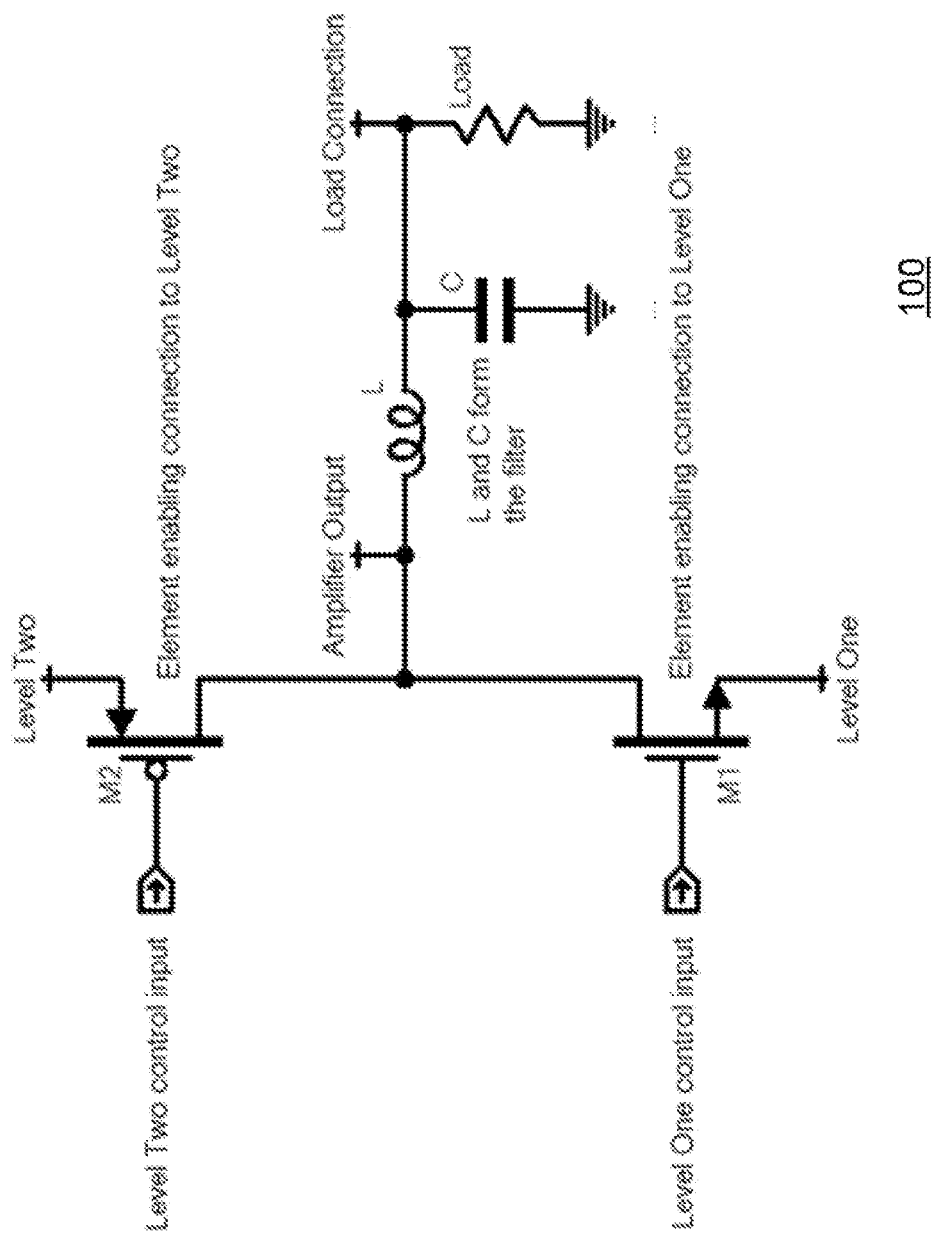
FIG. 1 is a block diagram of a class-D amplifier as is known in the prior art.
Figure 2:
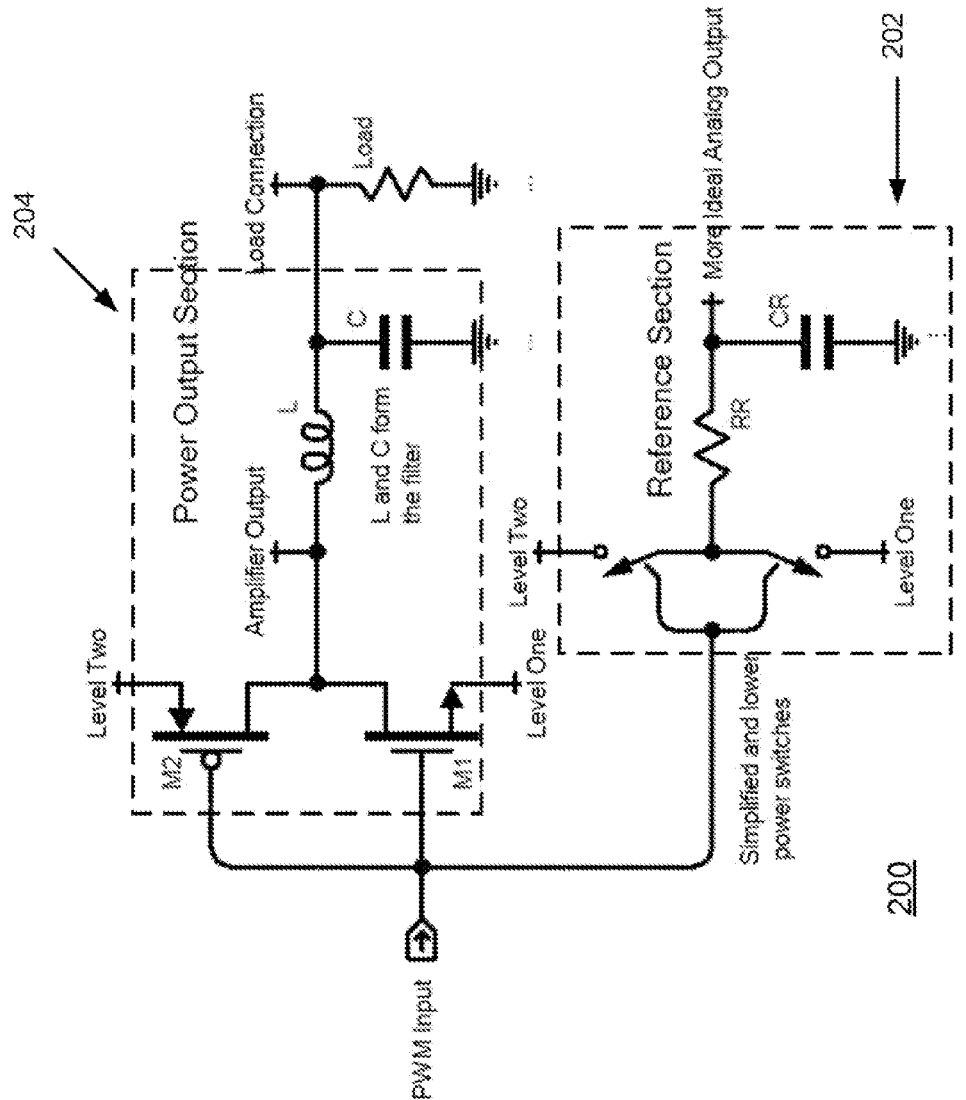
FIG. 2 is a block diagram of a class-D amplifier with a reference section as is known in the prior art.

FIG. 2 shows a class-D amplifier 200 in which a second set of components is connected to the PWM input to create a reference section 202 that generates a more ideal analog reference output. The switching elements in the reference section 202 may again form a complementary pair if desired, and may be created by using smaller, faster and better matched elements, since it does not need to generate a high power signal like the high-power output of the power output section 204 that drives the load. Also, since the reference section does not need to drive a significant load, the filter for the reference section may be a lower cost resistor-capacitor (RC) filter rather than the LC filter used in the power output section 204.

One of skill in the art will appreciate that as shown amplifier 200 is an inverting amplifier, i.e., because transistor M1 receives the PWM input and transistor M2 receives an inverted PWM signal, an increase in the PWM signal results in a decrease in output and vice versa. A designer will take this into account in generating the PWM signal corresponding to the desired analog input.

Using the reference output, the error between the reference output and the power output to the load can be measured, and the error can then be used to adjust the PWM signal that drives the power output section so as to reduce or suppress the error.

Figure 3:
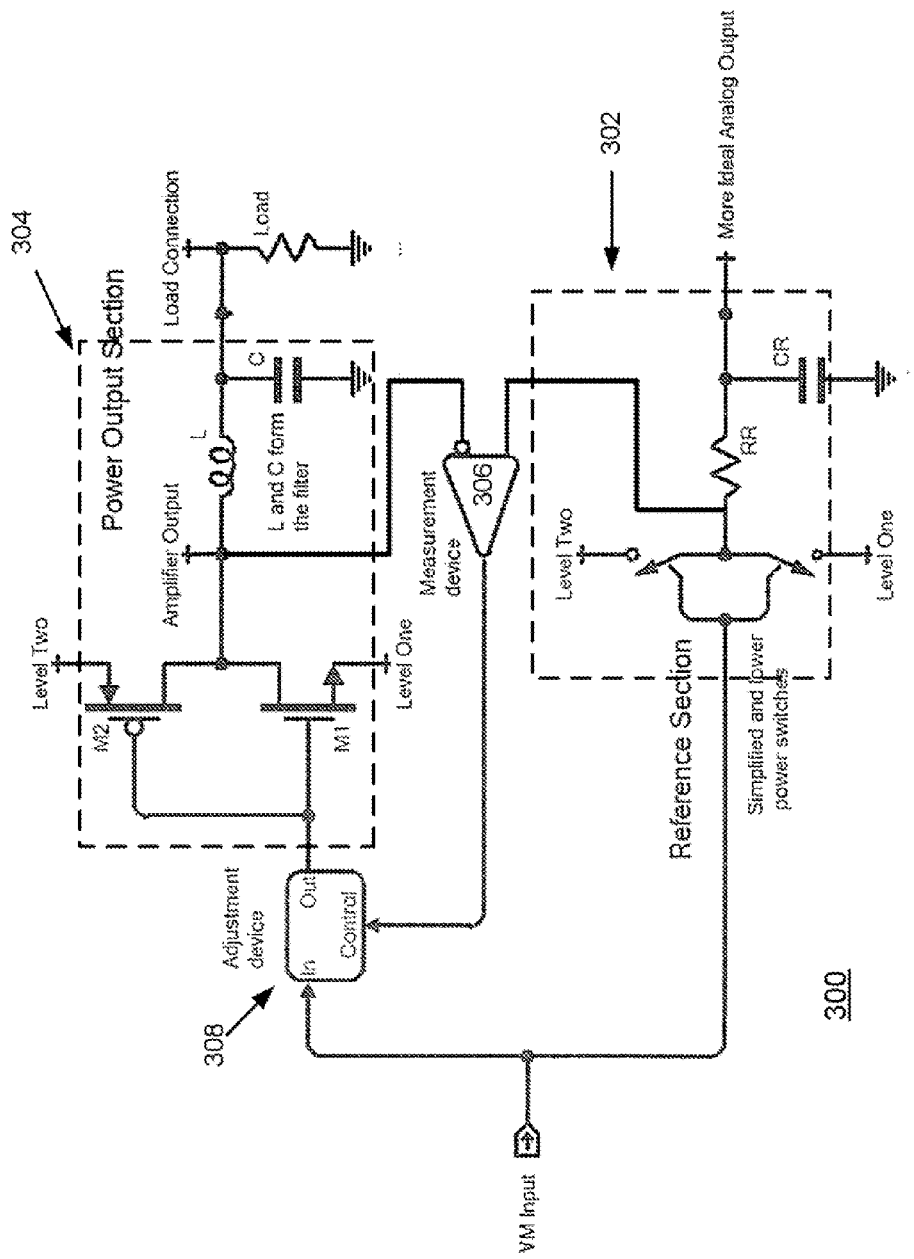
FIG. 3 is a block diagram of a class-D amplifier with a reference section and feedback of an error signal according to one embodiment.

FIG. 3 shows a class-D amplifier 300 with feedback of an error signal representing the difference between the reference output from a reference section 302 and the power output from the power output section 304. The error signal is created by comparing the output of the reference section 302 with the output of the power output section 304 by using a measurement device 306.

The error signal is sent to an adjustment device 308, which makes adjustments to the PWM signal that is input to the power output section 304, causing the output of the power output section 304 to be altered to more accurately reflect the PWM input signal. The feedback loop thus operates to measure and compensate for the difference between the output of the power output section 304 and the reference section 302, and thus to minimize the error signal.

As shown in FIG. 3, measurement device 306 is configured in a negative feedback configuration; measurement device 306 may be an op-amp configured in a non-inverting mode as shown in FIG. 3, or alternatively may be configured in an inverting "virtual ground" mode. Other ways of comparing the output of the reference section 302 to the output of the power output section 304 will be apparent to those of skill in the art.

Note that while the reference section 302 has Level One and Level Two as in the power output section 304, these need not be the same levels. One of skill in the art will appreciate that if the resulting voltage output of the reference section 302 is on a different scale than that of the power output section 304, it is a simple matter to normalize the outputs of the reference section 302 and power output section 304 so that they may be compared by measurement device 306.

Figure 4:
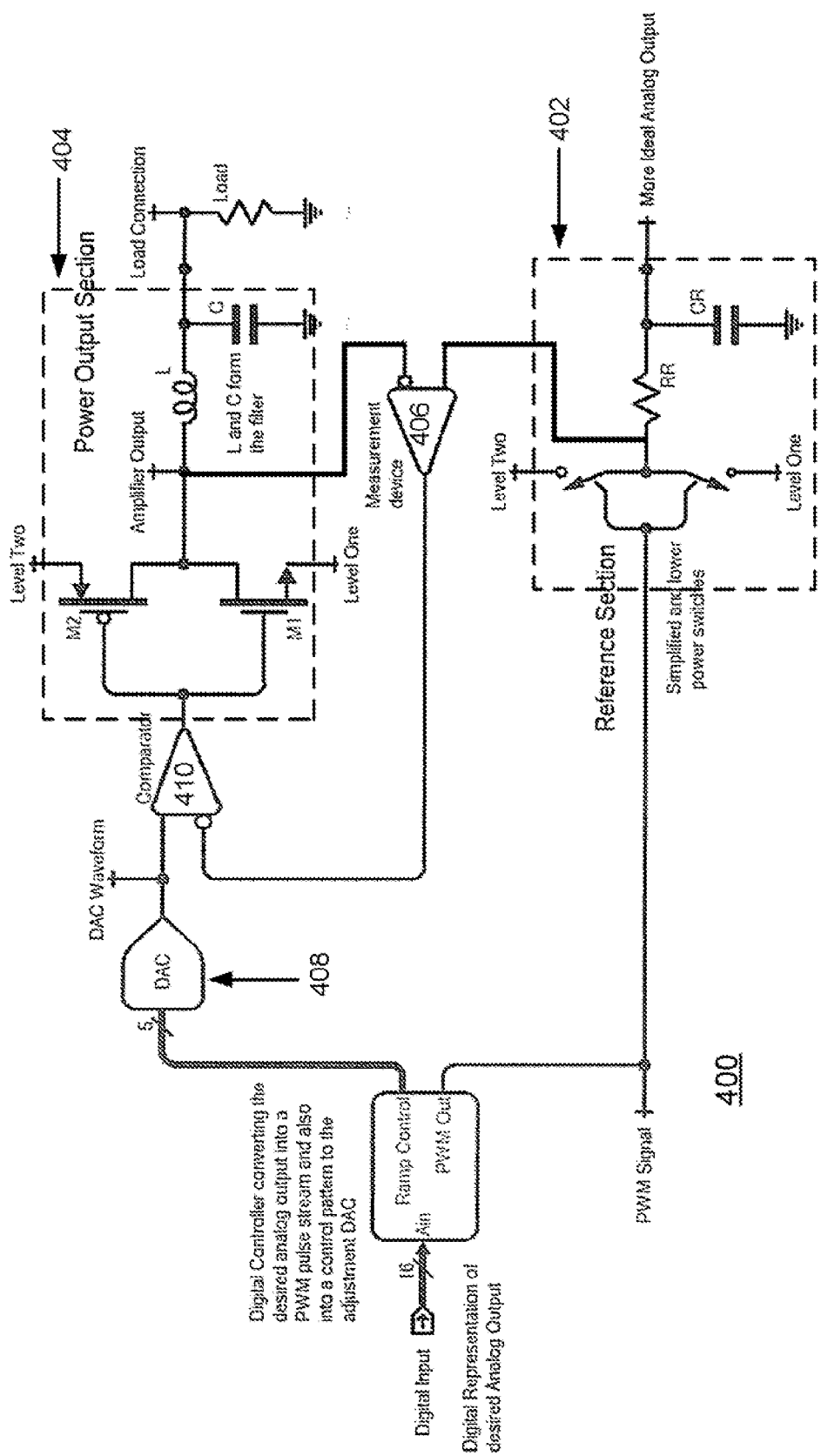
FIG. 4 is a block diagram of a class-D amplifier with a reference section and feedback of an error signal according to another embodiment.

FIG. 4 shows an implementation of one embodiment of the amplifier of FIG. 3. In FIG. 4 a class-D amplifier 400 again has a reference section 402 and a power output section 404, with the outputs of the two sections compared by a controller, here a measurement device 406, to generate an error signal. The adjustment of the input signal is done by a digital-to-analog converter (DAC) 408, which generates an analog DAC waveform, and another controller, here a comparator 410, which receives the DAC waveform and the error signal from the measurement device 406.

An analog input signal to be amplified is digitized by an analog-to digital converter (ADC) (not shown). The digital signal is input to a controller 412, which generates two signals: a PWM signal corresponding to the analog input signal is fed to the reference section 402, while a corresponding "correction" signal that is synchronous with the PWM signal is fed to the DAC 408. The DAC 408 converts the ramp signal back into an analog signal, the DAC waveform, which has a limited range in which the zero crossings match the voltage transitions of the PWM signal.

Comparator 410 outputs either a high or low value when the sum of its inputs is greater than zero, and this output drives the power output section 404. If the error signal is zero, i.e., the output of the power output section 404 matches the output of the reference section 402, then comparator 410 will generate a high output when the DAC waveform is positive, i.e., greater than zero, and a low output when the DAC waveform is negative, i.e., less than zero. Since as above the zero crossings of the DAC waveform are the same as the voltage transitions of the PWM signal, comparator 410 thus converts the DAC waveform back into the PWM signal if there is no error returned by measurement device 406.

Figure 5:
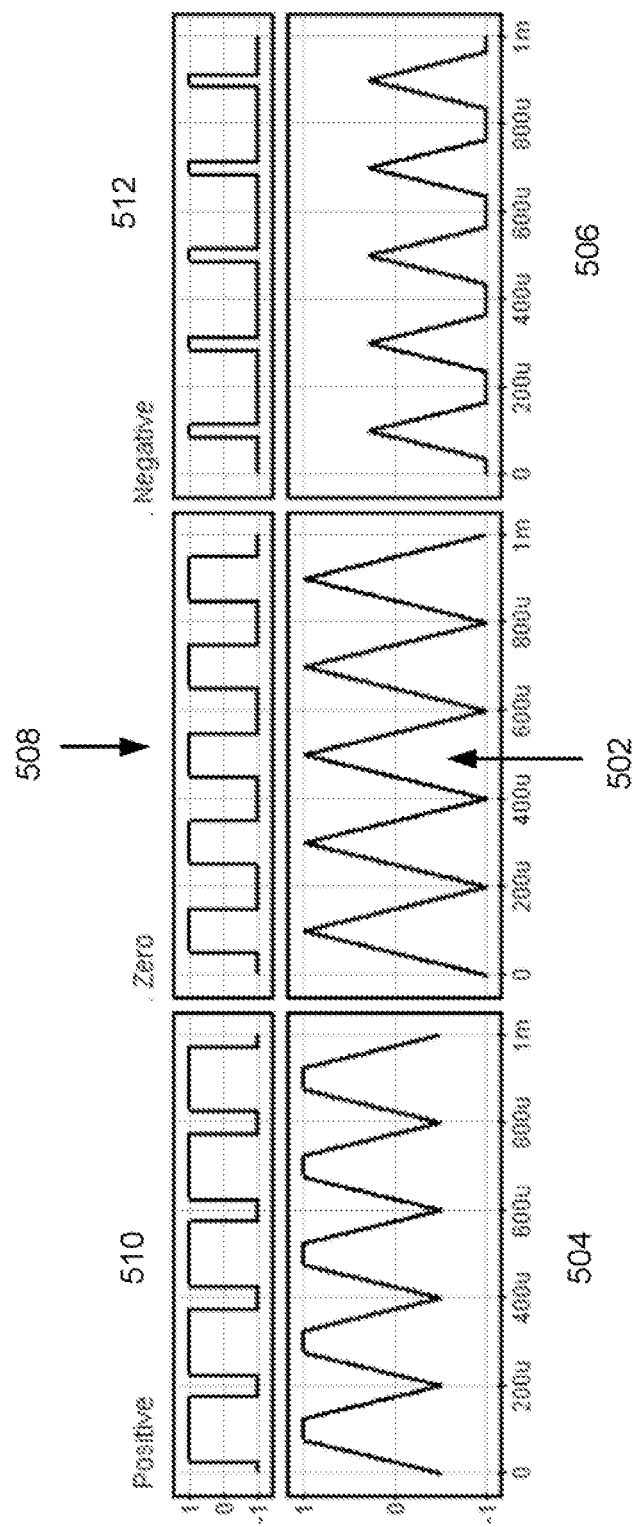
FIG. 5 is a graph showing the relationship of a correction signal to PWM signals representing the analog input in the embodiment of FIG. 4.

The relationship between the PWM signal representing the input analog signal and the DAC waveform may be seen in FIG. 5. In this example, the DAC waveform, has a triangular or "sawtooth" shape. Examples of the PWM signals representing the analog input are shown in curves 508, 510 and 512, while the corresponding DAC waveforms are shown in curves 502, 504 and 506.

When the input analog signal is zero, the PWM signal will, have an average value of zero and will regularly change from one state to the other, i.e., half of the time the PWM signal will be at a positive voltage, and the other half of the time the PWM signal will be at an equivalent but negative voltage. Since the DAC 408 creates a sawtooth DAC waveform in Which the zero crossings match the voltage transitions of the PWM signal, the DAC waveform will also have regular zero crossings and spend half of the time at voltage greater than zero, and the other half of the time at a voltage less than zero.

Such a triangular DAC waveform corresponding to an analog input of zero may be seen in curve 502 in FIG. 5. If an analog signal of zero is digitized and a corresponding DAC waveform is generated by DAC 408, it will look like curve 502. It will be appreciated that the voltages are arbitrary and need not be 1 and −1, although the two levels need to be distinct. One of skill in the art will be able to select appropriate voltage levels for a given application and particular components.

When the input analog signal is not zero, the PWM signal will likewise not have an average value of zero, and the DAC waveform will change accordingly. Thus, in curve 510 of FIG. 5, it may be seen that since the PWM signal is at a value of 1 more of the time than it is at −1, the average value of the PWM signal 510 is positive. Because of this, the voltage transitions now occur at different intervals.

Curve 504 shows the DAC waveform that corresponds to the PWM signal of curve 510. In order to have the zero crossings of the DAC waveform 504 match the voltage transitions of the PWM signal 510, DAC waveform 504 is shifted up from the zero average of curve 502. As stated above, the DAC waveform 504 is "clipped" to its range, i.e., its value never goes above 1.

Curve 512 shows a PWM signal with an average value of less than zero, i.e., it is at a value of −1 more than it is at 1. The corresponding DAC waveform 506 has now accordingly moved in the opposite direction from that of curve 504, i.e., DAC waveform 506 is shifted down from the zero input signal of curve 502. It may again be seen that the zero crossings of DAC waveform 506 correspond to the voltage transitions of PWM signal 512.

One of skill in the art will also appreciate that the DAC waveform need not be a triangular signal, but any signal that is greater than zero when the PWM signal is positive and less than zero when the PWM signal is negative, with zero crossings that correspond to the transitions of the PWM signal from positive to negative and vice versa, such that when the voltage of the DAC waveform is compared to zero the original PWM signal is created at the comparator output when the error signal is zero.

Returning to FIG. 4, comparator 410 will receive a DAC waveform corresponding to the analog input signal and the output of measurement device 406, i.e., the error signal. The error signal is inverted and comparator 410 sums the inverted, error signal with DAC waveform and then compares the sum to zero if that result is positive, then comparator 410 produces a high output to drive the power output section 404, while if the result is negative then comparator 410 produces a low output.

If the error signal from measurement device 406 is zero, the corresponding PWM signal that will be created by comparator 410 will be created in response to only the DAC waveform. It will be apparent that in such a case the PWM signal produced by comparator 410 will be identical to the PWM signal produced by controller 412 since both the power output section 404 and the reference section 402 are producing the same output as desired. Again, the voltages need not be 1 and −1 as shown.

When the error signal is not zero, as above it is inverted and summed with the DAC waveform by comparator 410, and the sum compared to zero. Comparator 410 will then again generate a PWM signal output to drive the power output section 404 based upon the zero crossings of the sum of the DAC waveform and the error signal.

Figure 6:
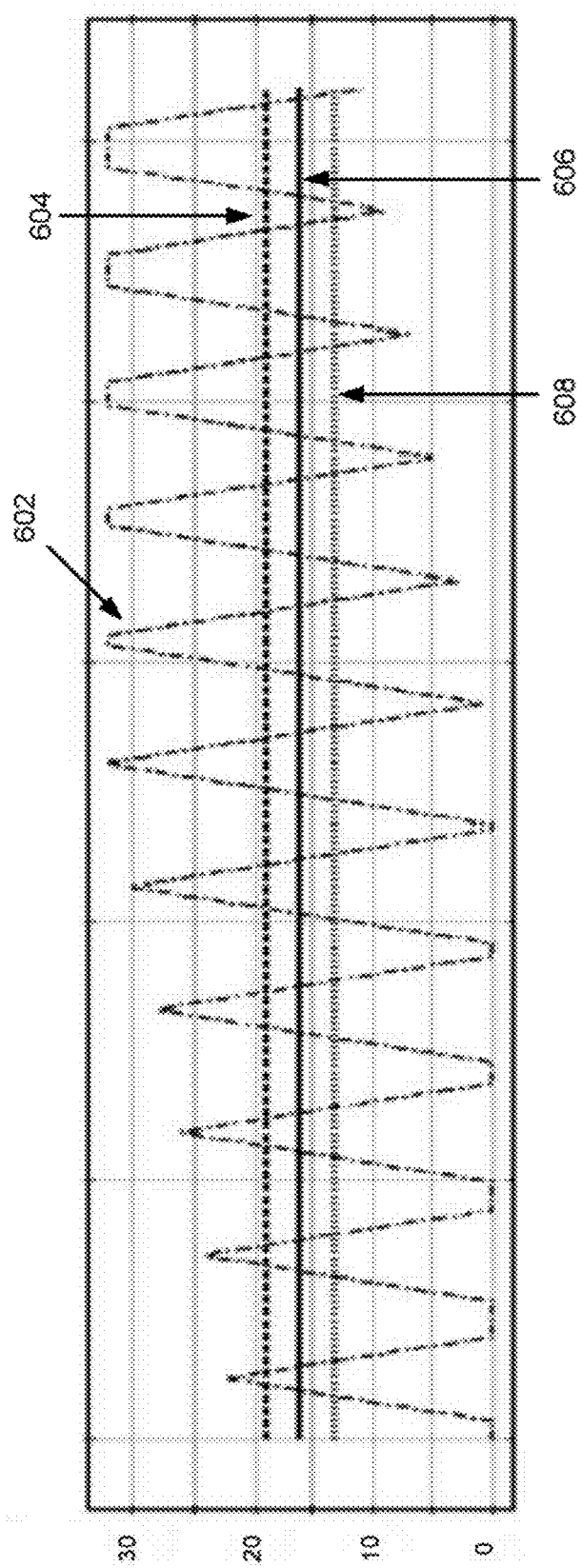
FIG. 6 is a graph showing a sample correction signal and error signals in the embodiment of FIG. 4.

FIG. 6 shows a triangular DAC waveform 602 that corresponds to an input signal that is a "ramp," i.e., a gradually increasing signal. It can be seen that the average value of DAC waveform 602 is increasing over the period of about 27 μS covered by FIG. 6, and that DAC waveform 602 is clipped at both a minimum "value" of about 2, and a maximum "value" of about 32 (as above, the mapping of these "values" to voltage is arbitrary). FIG. 6 also shows three possible error signals 604, 606, and 608; error signal 606 is the "zero" error signal, indicating that it represents that the output of the power output section 404 is the same as the output of the reference section 402 (on a normalized basis as above). Error signal 604 indicates that the output of the power output section 404 is lower than that of reference section 402, while error signal 608 indicates that the output of the power output section 404 is higher than that of reference section 402.

Figure 7:
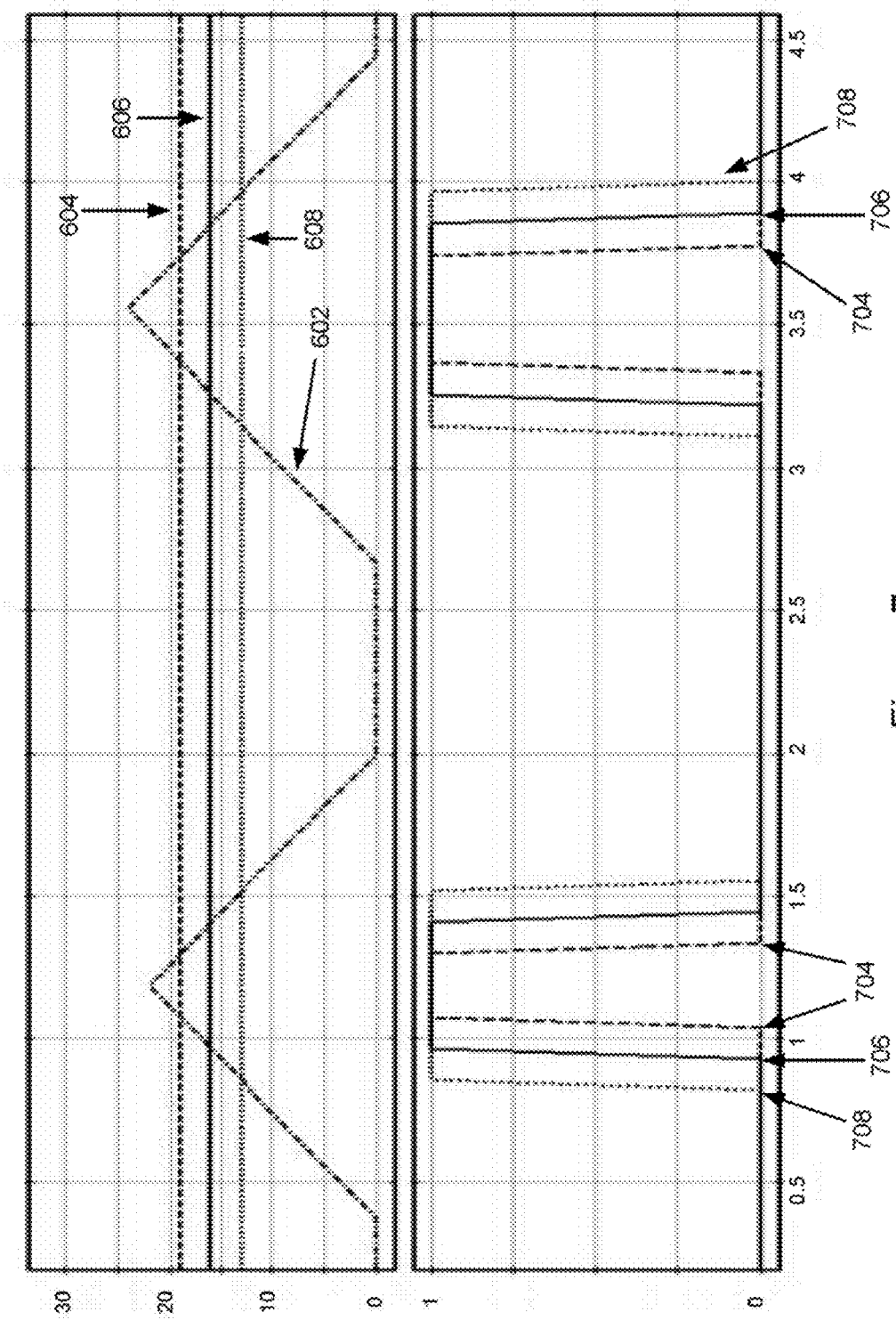
FIG. 7 is a graph of an expanded portion of FIG. 6 and including adjusted PWM signals according to one embodiment.

FIG. 7 shows an expanded view of the portion of DAC waveform 602 during the period from 0 to 4.5 μS, and the three error signals 604, 606 and 608. FIG. 7 also shows the PWM signal created by comparator 410 in response to the sum of the DAC waveform 602 and the inverse of each error signal. As above, the PWM signal is positive when the DAC waveform 602 exceeds the error signal, and the PWM state transitions occur when the DAC waveform voltage crosses the error signal voltage.

The PWM signal resulting from DAC waveform 602 and the "zero" error signal 606 includes the pulses indicated by lines 706. Since there is no error signal, i.e., no difference between the output of the power output section 404 and the reference section 402, the PWM signal 706 generated by the comparator 410 should be identical to the PWM signal created directly from the input analog signal and fed to the reference section 402.

On the other hand, error signals 604 and 608 indicate that the output of the power output section 404 is not the same as the output of the reference section 402, and the PWM signals corresponding to error signals 604 and 608 are thus adjusted to include the pulses indicated by lines 704 and 708 respectively. Again, error signal 604 indicates an output that is too low. Since the power output section 404 is inverting as above, it is expected that an error signal indicating a low output will result in shortening of the pulses in the PWM signal generated by comparator 410 as compared to the pulses 706 for the zero error signal 606. As seen by the pulses 704 in FIG. 7, this is the case. Conversely, error signal 608 indicates an output that is too high, which results in pulses 708 that are longer than the pulses 706 for the zero error situation.

Figure 8:
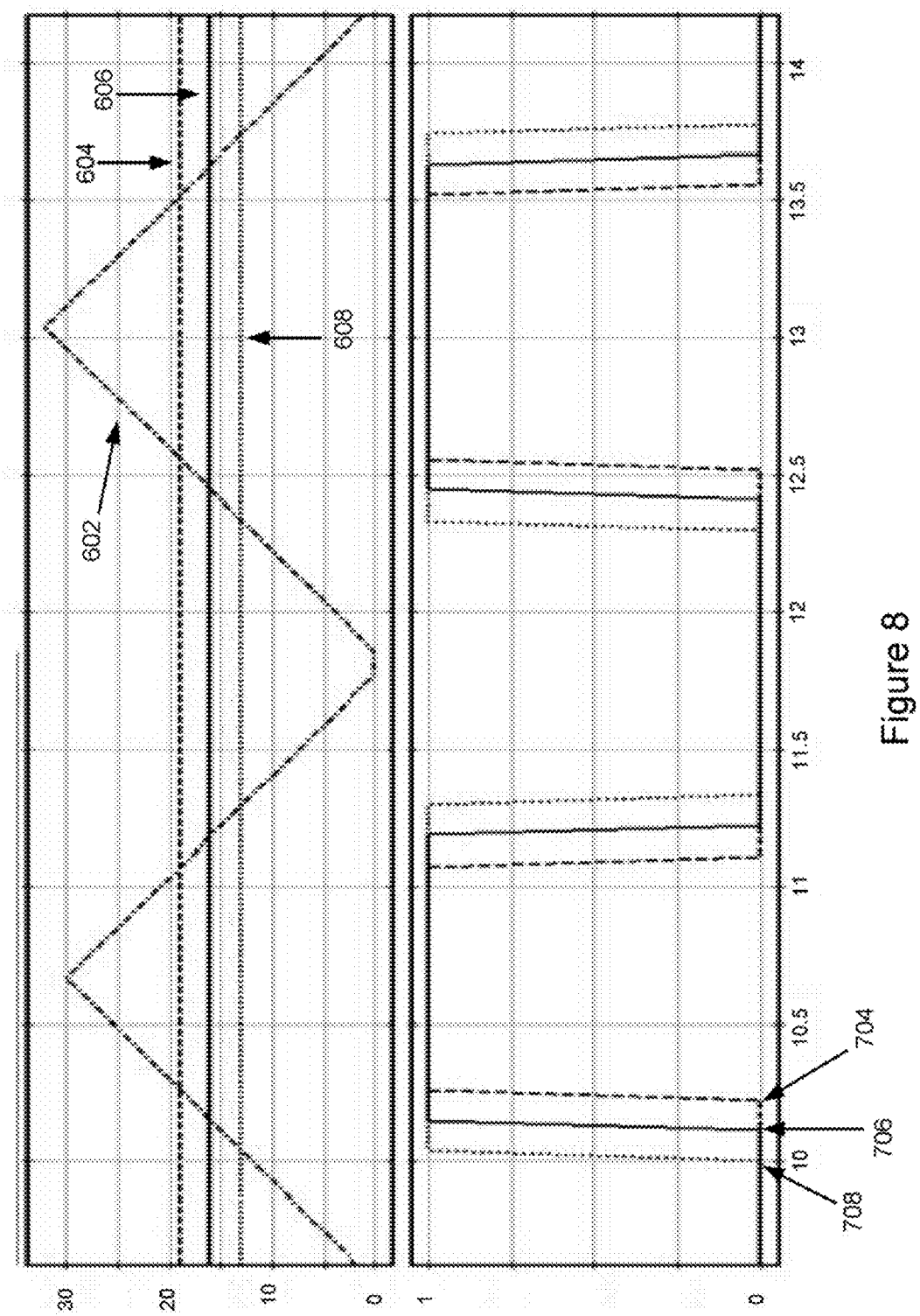
FIG. 8 is a graph of another expanded portion of FIG. 6 and including adjusted PWM signals according to one embodiment.

FIG. 8 shows an expanded view of the portion of DAC waveform 602 during the period, from about 9.5 to 14 μS, and the three error signals 604, 606 and 608. Again, the resulting PWM signals 704, 706 and 708 are seen, with the pulses of the PWM signal 704 for low output again being shorter than those of PWM signal 706 for zero error, and those of PWM signal 708 being longer, but overall all of the pulses are wider than in FIG. 7. This is also as expected; FIG. 8 represents a later portion of DAC waveform 602, and thus a higher average voltage since the input signal is again a ramp signal, so that the resulting PWM signal will have a higher average value.

Figure 9:
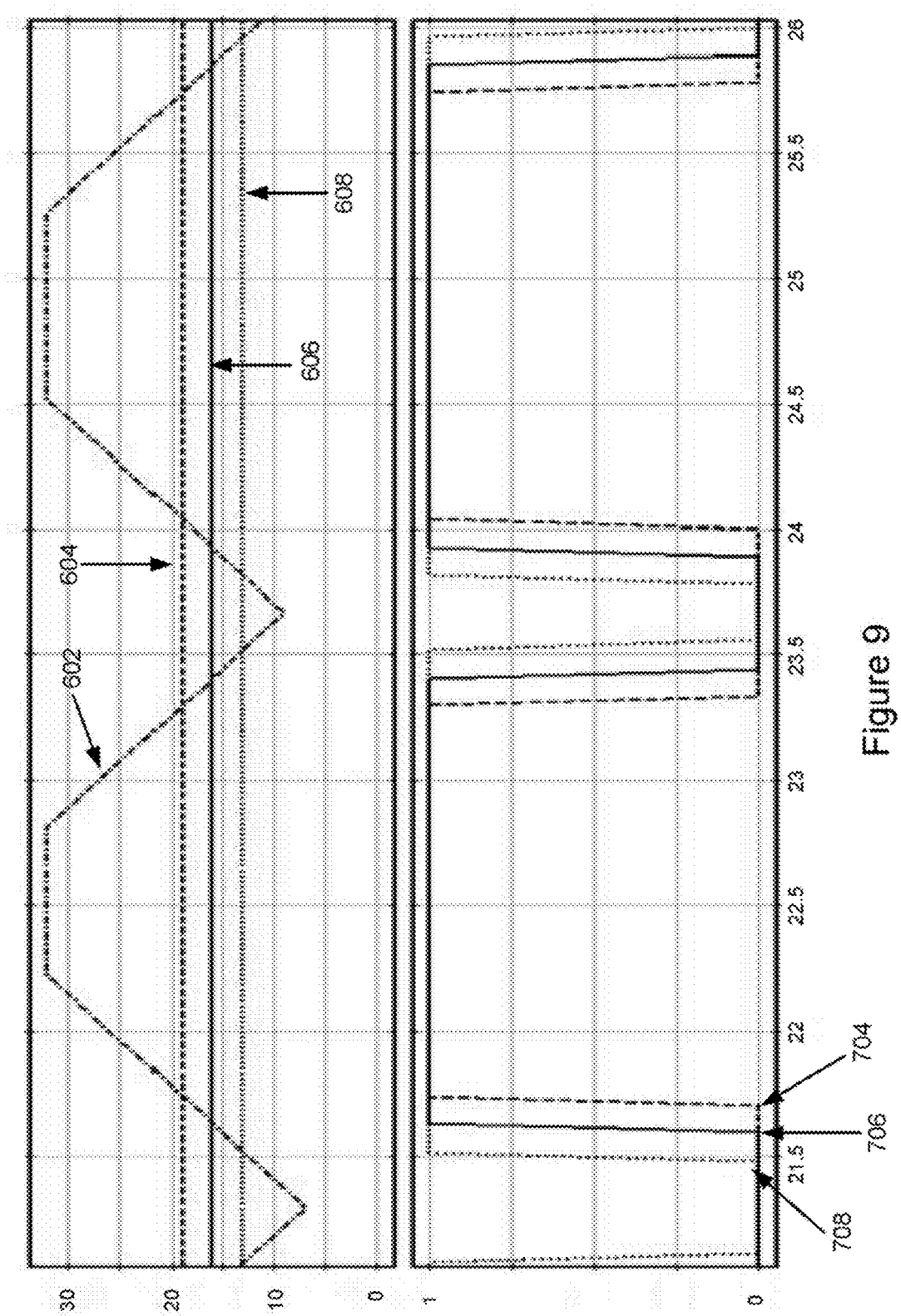
FIG. 9 is a graph of another expanded portion of FIG. 6 and including adjusted PWM signals according to one embodiment.

FIG. 9 similarly shows an expanded view of the portion of DAC waveform 602 during the period from about 21 to 26 μS, and the three error signals 604, 606 and 608. Again the resulting PWM signals 704, 706 and 708 show the same relationship, with PWM signal 704 having shorter pulses than PWM signal 706 and PWM signal 708 having longer pulses, and again overall they are wider than in FIG. 7 or 8, since the input signal is still higher than for FIG. 8.

When the PWM signal created b comparator 410 has a positive voltage, it will turn on transistor M1 and turn off transistor M2, and when the PWM signal has a negative voltage, it will turn on transistor M2 and turn off transistor M1. (One of skill in the art will appreciate that the power output section 404 will include a conditioning circuit between, comparator 410 and transistors M1 and M2 which will fix the voltage levels so as to account for the transistor threshold levels, as well as provide "dead time control" to improve efficiency While insuring that both transistors are never on at the same time to connect the voltage levels, a phenomenon known as "shoot through" which can result in excessive losses and even catastrophic failure of the transistors.)

From this it may be seen how the feedback loop of FIG. 4 works. If the voltage of the amplifier output from the power output section. 404 is the same as that of the output of the reference section 402 (as above, allowing for scaling), then the error signal 606 from measurement device 406 will be zero. Since comparator 410 will thus only compare the DAC waveform corresponding to the original PWM signal to zero, it will generate a PWM signal that looks like the original PWM signal. Thus, the power output section 404 and reference section 402 are effectively driven with identical signals, which is what is expected if there is no error.

Suppose, however, that the out put of the power output section 404 is too low. When the output of the power output section 404 goes down, the output of measurement device 406 will go up, since the output of the power output section 404 is inverted by measurement device 406, generating error signal 604. This increase is inverted again by comparator 410 and summed with the DAC waveform, resulting in the drop in average voltage of the summed waveform and a PWM signal output from comparator 410 with narrower pulse widths, as seen in pulses 704 in FIGS. 7, 8 and 9.

The narrower pulse width PWM signal 704 is input to the power output section 404 of the amplifier 400, and, due to the inverted input to the power output section 404 as described above, has the effect of increasing the output of the power output section 404, thus reducing the error as desired.

If the output of the power output section 404 is too high, these signals will change in the opposite direction, reducing the level of the error signal 608, thus resulting in an increase in the pulse widths of the PWM signal 708 and a decrease in the output power, again reducing the error signal. In either case, the reduced error signal is in turn fed back to comparator 410, and the process continues as long as the amplifier 400 is in operation.

In practical operation, the adjustments to the DAC waveform and the PWM signal output by comparator 410 are not nearly as large as they appear in FIGS. 5 through 9, if the distortion is 0.1%, the error signal will likely be measured in millivolts, while the DAC waveform might for example have a frequency of 400 kilohertz (KHz) and thus a period of 2.5 microseconds (μs). A 0.1% adjustment thus represents one part in a thousand, so that the change in the zero crossing of the DAC waveform might be 2.5 μs times 1/1000, or 2.5 nanoseconds (ns), a small adjustment.

Figure 10:
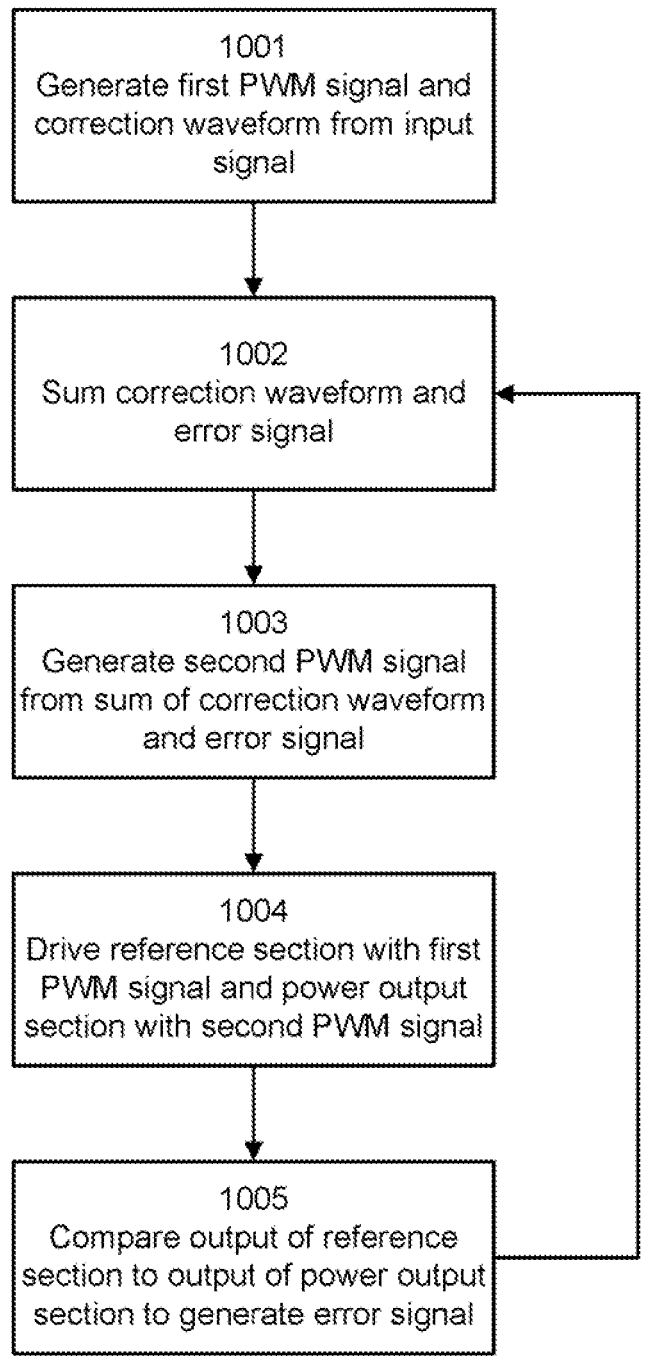
FIG. 10 is a flow chart of a method of reducing distortion in a class-D amplifier according to one embodiment.

FIG. 10 shows a simplified flowchart of one embodiment of the method described herein. At step 1001, a first PWM signal is generated from the input signal, for example by controller 412 in FIG. 4, and a correction waveform corresponding to the PWM signal is generated, for example by the creation of a digital signal by controller 412 and the conversion of the digital signal to an analog signal by DAC 408.

Next, at step 1002 the correction waveform, and an error signal are summed, for example by comparator 410. A second PWM signal is then generated from the sum of the correction waveform and the error signal at step 1003, for example again by comparator 410 in FIG. 4.

At step 1004, the power portion of the amplifier, such as power output section 404 in FIG. 4, is driven with the second PWM signal, while the reference section, such as 402 in FIG. 4, is driven with the first PWM signal. The outputs of the two sections are then compared in step 1005, such as by measurement device 406 in FIG. 4, to generate the error signal which is fed back to, for example, comparator 410 for use in a subsequent instance of step 1002.

In practice, upon commencement of operation, there will be no error signal until signals have promulgated through the system, and there may be slight time lags between the time the power output section and reference section operate on a particular portion of signal and the time the error signal is fed back. However, if the amplifier operates at a sufficiently high rate, typically 10 times or more faster than the frequency of the signal being input, the time lags will be small and distortion will be significantly reduced.

Figure 11:
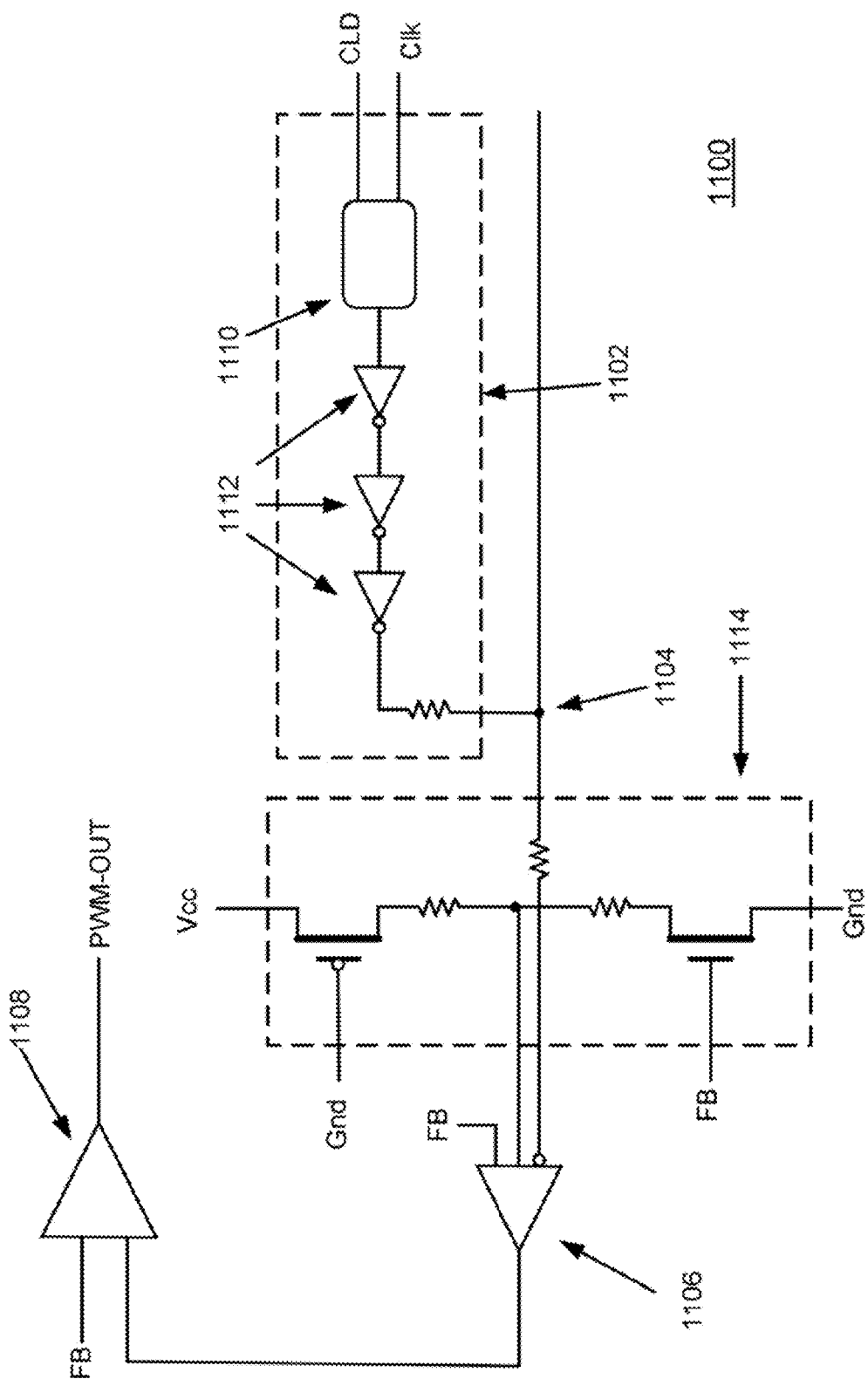
FIG. 11 is a Hock diagram of a portion of a class-D amplifier having a reference section and feedback of an error signal according to another embodiment.

FIG. 11 shows a schematic diagram of a portion of a class-D amplifier using principles as described herein in one embodiment. Circuit 1100 includes a reference section 1102, comprised of a flip-flop 1110 and switches 1112, which receives the input PWM signal CLD. The scaled output from the power output portion of the amplifier (not shown) is received at FB. Thus, at node 1104, both the power output signal and the reference signal are present and summed.

After some further processing by op-amp 1106 (which would be considered part of measurement device 406 in FIG. 4), the summed signal is input to comparator 1108, which also receives the output of a DAC (not shown) and functions as comparator 410 in FIG. 4. The output of comparator 1108 is signal PWM-OUT, the adjusted signal which drives the power output section as described above. One of skill in the art will appreciate the additional circuitry required to implement the design of FIG. 4, as well as alternative ways to implement the various functions described.

The disclosed system has been explained above with reference to several embodiments. Other embodiments will be apparent to those skilled in the art in light of this disclosure. Certain, aspects of the described, method and apparatus may readily be implemented using configurations other than those described in the embodiments above, or in conjunction with elements other than or in addition to those described above. For example, as is well understood by those of skill in the art, voltages other than those mentioned herein may be used, and there are various types of devices available suitable for use as measurement devices, comparators, DACs, etc.

It should also be appreciated that the described method and apparatus can be implemented in numerous ways, including as a process, an apparatus, or a system. The methods described herein may be implemented by program in for instructing a processor to perform such methods, and such instructions recorded on a computer readable storage medium such as a hard disk drive, floppy disk, optical disc such as a compact disc (CD) or digital versatile disc (DVD), flash memory, etc., or a computer network wherein the program instructions are sent over optical or electronic communication links. Such program instructions may be executed by means of a processor or controller, or may be incorporated into fixed logic elements. It should be noted that the order of the steps of the methods described herein may be altered and still be within the scope of the disclosure.

These and other variations upon the embodiments are intended, to be covered by the present disclosure, which is limited only by the appended claims.

What is claimed is:

1. A class-D amplifier circuit comprising:
    a first controller for generating a first PWM signal which alternates between two PWM signal values corresponding to an input signal;
    a DAC for creating a correction signal which is greater than a first selected value when the PWM signal is at a first one of the two PWM signal values and less than the first selected value when the PWM signal is at the other of the two PWM signal values, and which crosses zero when the PWM signal transitions from one of the two PWM signal values to the other;
    a second controller for summing the correction signal and an error signal and generating a second PWM signal, the second PWM signal corresponding to the sum of the correction signal and the error signal and changing state when the sum crosses a second selected value;
    a first switching element and a second switching element connected in series between two voltages for receiving the second PWM signal and producing in response thereto a first output signal of a power sufficient for driving a desired load with a distortion of the input signal;
    a third switching element and a fourth switching element connected in series between two voltages for receiving the first PWM signal and producing a second output signal with a lower distortion of the input signal than the first output signal; and
    a third controller for generating the error signal based upon the difference between the first output signal and the second output signal.

2. The class-D amplifier circuit of claim 1 wherein the switching elements are transistors.

3. The class-D amplifier circuit of claim 1 wherein the switching elements are MOSFETs.

4. The class-D amplifier circuit of claim 1 wherein the switching elements are bi-polar transistors.

5. The class-D amplifier circuit of claim 1 wherein the second controller is a comparator.

6. The class-D amplifier circuit of claim 5 wherein the comparator is an op-amp.

7. The class-D amplifier circuit of claim 1 wherein the second controller for summing is an op-amp.

8. The class-D amplifier circuit of claim 1 wherein the second PWM signal is positive when the sum of the correction signal and the error signal is greater than the second selected value and negative when the sum is less than the second selected value.

9. The class-D amplifier circuit of claim 1 wherein the second PWM signal is negative when the sum of the correction signal and the error signal is greater than the second selected value and positive when the sum is less than the second selected value.

10. A method of reducing distortion in a class-D amplifier circuit having a first pair of switching elements in series between two voltages and which produces an output signal of a power sufficient for driving a load in response to a PWM signal, comprising:
    generating a first PWM signal corresponding to an input signal;
    generating a correction signal which is greater than a first selected value when the PWM signal is at a first one of two PWM signal values and less than the first selected value when the PWM signal is at the other of the two PWM signal values, and which crosses zero when the PWM signal transitions from one of the two PWM signal values to the other;

summing the correction signal and an error signal and generating a second PWM signal, the second PWM signal corresponding to the sum of the correction signal and the error signal and changing state when the sum crosses a second selected value;

driving the first pair of switching elements with the second PWM signal to generate the output signal;

producing a reference signal of a lower power than the output signal based upon the first PWM signal; and generating the error signal based upon the difference between the output signal and the reference signal.

11. The method of claim 10 wherein producing a reference signal comprises driving a second pair of switching elements in series between two voltages to produce the reference signal.

12. The method of claim 10 wherein summing the correction signal and an error signal and generating a second PWM signal comprises inverting the error signal and summing the inverted error signal and the correction signal, and comparing the result to the second selected value, with a comparator.

13. The method of claim 12 wherein the comparator comprises an op-amp.

14. The method of claim 10 wherein generating the error signal further comprises inverting the output signal and summing the inverted output signal and the reference signal with a summer.

15. The method of claim 14 wherein the summer comprises an op-amp.

16. The method of claim 10 wherein generating a correction signal comprises;

generating a digital signal with a controller, the digital signal indicating crossings of the first selected value corresponding to the PWM signal transitions from one of the two PWM signal values to the other; and converting the digital signal to an analog correction signal.

17. The method of claim 16 wherein the digital signal is converted to an analog correction signal with a DAC.

18. The method of claim 10 wherein the second PWM signal is positive when the sum of the correction signal and the error signal is greater than the second selected value and negative when the sum is less than the second selected value.

19. The method of claim 10 wherein the second PWM signal is negative when the sum of the correction signal and the error signal is greater than the second selected value and positive when the sum is less than the second selected value.

* * * * *